United States Patent
Izumi et al.

(10) Patent No.: US 7,576,475 B2
(45) Date of Patent: Aug. 18, 2009

(54) ACTUATOR DEVICE AND METHOD OF MANUFACTURING THE SAME

(75) Inventors: Tomoo Izumi, Toyonaka (JP); Akira Kosaka, Yao (JP); Mitsuhiro Fukuda, Chofu (JP)

(73) Assignee: Konica Minolta Opto, Inc., Hachioji-shi (JP)

( * ) Notice: Subject to any disclaimer, the term of this patent is extended or adjusted under 35 U.S.C. 154(b) by 0 days.

(21) Appl. No.: 11/820,654

(22) Filed: Jun. 20, 2007

(65) Prior Publication Data

US 2008/0007140 A1     Jan. 10, 2008

(30) Foreign Application Priority Data

Jun. 27, 2006 (JP) .............................. 2006-176305
Jun. 8, 2007 (JP) .............................. 2007-152460

(51) Int. Cl.
   *H01L 41/083* (2006.01)
(52) U.S. Cl. ................................................ 310/328
(58) Field of Classification Search ................ 310/328, 310/363–366
   See application file for complete search history.

(56) References Cited

U.S. PATENT DOCUMENTS 4,627,138 A * 12/1986 Im .............................. 29/25.35
4,978,881 A * 12/1990 Wakita et al. ................ 310/328
5,614,044 A * 3/1997 Nagayama et al. ......... 29/25.35
6,930,438 B2 * 8/2005 Cramer et al. .............. 310/328
2008/0007143 A1 * 1/2008 Nakamura et al. .......... 310/358

FOREIGN PATENT DOCUMENTS

JP          62092381 A  *   4/1987
JP       2005-318712 A     11/2005

OTHER PUBLICATIONS

Yusaku Kato et al, "A Flexible, Lightweight Braille Sheet Display with Plastic Actuators Driven by an Organic Field-Effect Transistor Active Matrix", IEEE International Electron Devices Meeting, Washington DC, Dec. 5-7, 2005, #5.1, pp. 105-108.

* cited by examiner

*Primary Examiner*—Jaydi SanMartin
(74) *Attorney, Agent, or Firm*—Sidley Austin LLP

(57) ABSTRACT

An actuator device which is made as a laminated structure including a displacement-functioning layer having a region to be deformed by the electric field and an electrode-functioning layer having a region to function as an electrode. And an manufacturing method in which the above-mentioned device is easily manufactured, the method in which, according to the laminated structure, arranging each layer to be formed on the transfer section and transferring it onto the substrate to laminate.

3 Claims, 6 Drawing Sheets

ACTUATOR DEVICE AND METHOD OF MANUFACTURING THE SAME

This application is based on Japanese Patent Application No. 2006-176305 filed on Jun. 27, 2006, and No. 2007-152460 filed on Jun. 8, 2007, in Japanese Patent Office, the entire content of which hereby incorporated by reference.

TECHNICAL FIELD

The present invention relates to an actuator device in which a thin film including a material, which is displaced by application of an electric field, is laminated, and a method of manufacturing the device.

BACKGROUND

Recently, in various fields such as a medical device, industrial, personal robot, micro-machine, the development of the micro-machine is promoted. Recently, when the semiconductor micro-fabrication engineering is applied, a micro-mini mechanical part or motor whose size is several μm can be made on a silicon substrate.

On the one hand, in the field of the electronics, such a trial that an actuator device, which is a basic movement region of the micro-machine, is fabricated by using an organic material instead of inorganic material such as silicon is brought into active. Because the organic actuator device has lightness in weight and flexibility in addition to excellent molding property, new and various application is expected.

Conventionally, in the case of the actuator which operates as a micro-machine, the friction or viscosity becomes more dominant than the inertial force with conventional machines. Thus, as the mechanism which converts the energy into the movement, a principle of movement such as the electro static attraction force type, piezo-electric type, ultrasonic type, shape-memory alloy type has been newly proposed.

Particularly, because the piezo-electric type device has a large generation force per unit volume, even a small sized device can generates a practical drive force, and it is used for the actuator of the small sized image pick-up apparatus. The main stream of the present piezo-electric type is an inorganic actuator called PZT (Pb (Zr, Ti)O$_3$).

However, because the displacement amount of PZT is very small, for a case where the large displacement amount or large speed is necessary, it is not appropriate. Further, because PZT includes lead, there is a possibility that its use is limited in future.

Further, in the inorganic actuator, its sintering temperature is as high as about 1000° C., for example, when made into MEMS (micro electro mechanical system), there is a problem in the hybrid capability with circuits. Further, a problem that there is no easy fabrication method prevents the inorganic actuator from being MEMS, miniaturized and integrated.

Also with other inorganic small sized actuators, there is a limitation in respective operation envelopment, or there is a problem that the response is insufficient, the mechanism is complicated, or there is a problem that flexibility is not enough, accordingly, the purpose of use is also limited.

To accommodate these problems, the actuator device using a light and flexible organic material is brought into investigation. Generally, because Young ratio of the organic material is low, (flexible), the displacement force is smaller than that of the inorganic material, however, the displacement amount is large. Further, in the fabrication, because the wet-process such as the inkjet method or printing method can be used, the fabrication of low cost or large area is possible, further, the flexible substrate compatibility is also available.

For the fabrication and application of these organic actuator devices, several technologies are reported (for example, refer to Japanese Laid-Open Patent Publication No. 2005-318712, and Non-Patent Document 1).

According to Japanese Laid-Open Patent Publication No. 2005-318712, by using poly methyl methacrylate as the organic material of the actuator device, by press molding, minute protrusions (cylindrical actuator device) are densely arranged on the plane substrate. As an operation the electric energy is converted into the heat, the minute protrusion is inclined by the difference of the expansion coefficient. By giving the phase difference to the electric signal, the phase difference is generated in the occurrence of the inclination of the protrusions, for example, the minute particle on the protrusion can be transferred.

However, the manufacturing becomes simple by using molding, however, the displacement amount is small, further, minute protrusion can not be individually driven. Further, heat is employed for the drive, there is a problem in efficiency and control.

In the non-patent document 1, par-fluoro-polymer electrolyte film is used as the sheet type soft actuator, when it is adhered to the sheet on which TFT elements are formed, the point system display is made. The actuator device formed and arranged on the sheet is the bend type actuator which is bent by the drive voltage, and the actuator is independently driven by the electric signal through respective TFT elements and protruded from the sheet to display the point system.

However, although the manufacturing can be said simpler than the conventional one, when the bend type actuator is used for the purpose of obtaining an enough displacement amount, there is a problem in down-sizing and high integration. An actuator device in which, while large displacement amount is secured, the down-sizing and the high integration hare possible and the manufacturing is simple, is required.

[Non-Patent Document 1]

Kato, Iba, Sekitani, Noguchi, Hizu, "A Flexible, Light weight Braille Sheet Display with Plastic Actuator driven by An Organic Field Effect transistor Active Matrix." IEEE International Electron Devices Meeting, Washington, D.C., Dec. 5-7, 2005, #5.1, pp. 105-108.

As described above, the actuator of inorganic material is difficult to be made miniaturized or integrated, the manufacturing is also difficult. Further, there is a problem that there is a limitation in the operation environment, or the response is insufficient, the mechanism is complicated, or flexibility is insufficient. PZT which is a mainstream, further, has a problem of environmental load as it contains lead.

The actuator of the organic material has also been developed, however, the problem of miniaturization and integration still exists, and the realized displacement amount can not be sufficient. Further, for the method of manufacturing also, the more simple and effective manufacturing method is required.

SUMMARY

The object of the present invention is to solve the above described problems, and to provide an actuator device in which a practical drive force and a large displacement amount can be realized, miniaturization and integration are easy, and further, environmental load is small. Further, the object is to provide the method of the manufacturing the actuator device by which the above-described actuator device can be easily manufactured, and an array of a plurality of elements can be manufactured at a time. Further, to provide the method of manufacturing the integrated organic actuator device in which the large displacement amount, which is difficult in the conventional organic actuator, can be realized, and miniaturization and integration is possible. In view of forgoing, one embodiment according to one aspect of the present invention is an actuator device including a laminated body, comprising:

(a) a plurality of displacement functioning layers which are displaced in a direction of thickness in response to application of an electric field; the displacement functioning layer including:

(a-1) a displacement region which is displaced in a direction of thickness in response to the application of the electric field; and (a-2) a pair of displacement functioning layer electrode regions which are separated by the displacement region, and (b) a plurality of electrode functioning layers which are adapted to hold the displacement functioning layer therebetween to apply the electric field in the direction of thickness of the displacement functioning layer, the electrode functioning layer including:

(b-1) an insulation region which is provided in a vicinity of an interface of the displacement region and the displacement functioning layer electrode region of the displacement functioning layer; and (b-2) a pair of electrode functioning layer electrode regions which are separated by the isolation region, wherein the laminated body includes the displacement functioning layer and the electrode functioning layer, each of the pair of the displacement functioning layer electrode regions and each of the pair of the electrode functioning layer electrode regions are electrically connected to each other, and those connected displacement functioning layers and electrode functioning layers compose electrode sections which are adapted to apply the electric field to the displacement region.

According to another aspect of the present invention, another embodiment is a method of manufacturing an actuator device including a laminated body, the method comprising the steps of:

forming a displacement functioning layer by providing a film of an organic displacement material on a transfer section of a transfer apparatus; and transferring the displacement functioning layer formed on the transfer section from the transfer section onto a substrate, wherein the actuator device comprises:

(a) a plurality of displacement functioning layers which are displaced in a direction of thickness in response to application of an electric field; the displacement functioning layer including:

(a-1) a displacement region which is displaced in a direction of thickness in response to the application of the electric field; and (a-2) a pair of displacement functioning layer electrode regions which are separated by the displacement region, and (b) a plurality of electrode functioning layers which are adapted to hold the displacement functioning layer therebetween to apply the electric field in the direction of thickness of the displacement functioning layer, the electrode functioning layer including:

(b-1) an insulation region which is provided in a vicinity of an interface of the displacement region and the displacement functioning layer electrode region of the displacement functioning layer; and (b-2) a pair of electrode functioning layer electrode regions which are separated by the isolation region, wherein the laminated body includes the displacement functioning layer and the electrode functioning layer, each of the pair of the displacement functioning layer electrode regions and each of the pair of the electrode functioning layer electrode regions are electrically connected to each other, and those connected displacement functioning layers and electrode functioning layers compose electrode sections which are adapted to apply the electric field to the displacement region.

DETAILED DESCRIPTION OF THE PREFERRED EMBODIMENT

Figure 1:
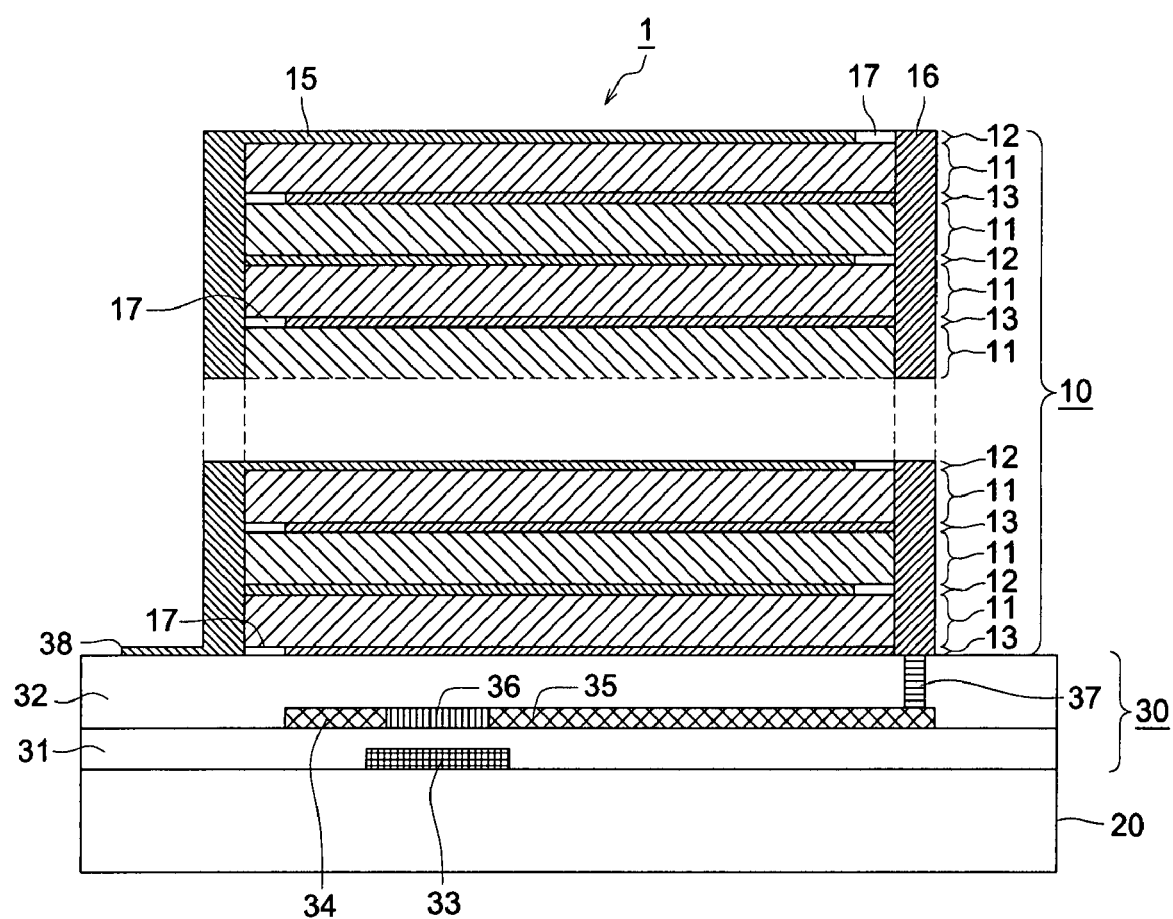
FIG. 1 is a sectional view showing the general structure of an actuator device 1.

Referring to the drawings, an embodiment of the present invention will be described below.

By using FIG. 1, the structure of an actuator device 1 according to the present embodiment will be described below. FIG. 1 is a sectional view showing the general structure of the actuator device 1. In the view, although shown as the single actuator device, as will be described later, many actuator devices are 2-dimensionally array arranged, and can also be used for the 2-dimensional operation.

In the view, numeral 1 is an actuator device, and consists of TFT (thin film transistor) element 30 formed on a substrate 20 as the support body, and a laminated body 10 which is the actuator portion formed further thereon.

The laminated body 10 is, the thin film including a material having the function deformable by the electric field, that is, displacement functioning layers (hereinafter, referred to displacement layers) 11, and an electrode functioning layer (hereinafter, referred to an electrode layer) 12 having the function for applying an electric field on those displacement functioning layers 11 and the electrode functioning layer 13 are laminated as the view. As the material deformable by the electric field, the organic displacement material is preferable, in the present embodiment, the organic displacement material is used.

The laminated body 10 has the function deforming by application of the electric field as the actuator part (herein, the function in which the film thickness is changed). The laminated layer structure of the laminated body 10 is as follows.

The displacement layer 11 is repeatedly laminated more than 10 layers. Then, in the interface of the laminated mutual displacement layers, the electrode layer 12 or the electrode layer 13 are alternatively inserted. That is, respective displacement layer 11 is individually sandwiched between the electrode layer 12 and the electrode layer 13. Hereby, the electric field is effectively applied on each displacement layer 11.

Figure 2:
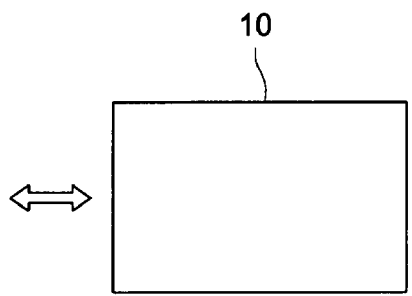
FIGS. 2(b), 2(a) and 2(c) are sectional views that schematically show the appearance of the deformation of an actuator portion.
Figure 2:
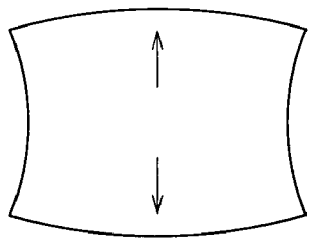
Figure 2:
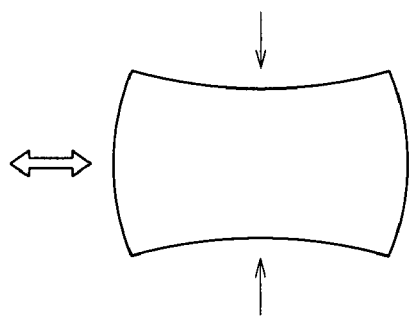

Each of the displacement layers 11 includes a thin film formed of organic polymer, and these layers function as an actuator by the electric field drive. These thin layers function as actuator devices by deforming in response to the applied electric field. FIGS. 2(*a*), 2(*b*) and 2(*c*) schematically show the appearance that the laminated body 10 including these thin layers deforms in response to the applied electric field. The laminated body of FIG. 2(*a*) deforms like FIGS. 2(*b*) or 2(*c*) in response to the applied electric field.

The electrode layers 12, 13, the details of which will be described later, in order to apply the electric field on the displacement layer 11 described above, a large and small two electrode layer electrode regions are disposed as described above holding the insulation layer 17 between them so that the two electrodes do not electrically connected. The electrode regions are constructed so that one of the electrode regions composes the electrode potion 15 and is coupled to the common electrode 38, and the other electrode composes the electrode 16 and is coupled to a drain electrode 35 of the TFT element 30 for driving as described later.

The TFT element 30 supplies the signal voltage for applying to the actuator part, that is, the laminated body 10, and has the function for driving the laminated body 10 as the actuator. The structure of the TFT element 30 is as follows.

On the substrate 20, the gate electrode 33 is provided at one part. The gate electrode 33 is covered by the gate insulation film 31, and the semiconductor part 36 is provided at the position corresponding to the gate electrode 33 with the gate insulation film 31 between them. On the gate insulation film 31, further, source electrode 34 and drain electrode 35 are provided, and the semiconductor part 36 has the function to electrically connect the both. That is, when the signal voltage is impressed on the gate electrode 33, the conductivity is established in the semiconductor part 36, the electric potential impressed on the source electrode 34 is impressed on the drain electrode 35.

The source electrode 34, semiconductor part 36, drain electrode 35 are covered by the passivation layer 32. Hereupon, the contact hole 37 is provided in the passivation, layer 32, the drain electrode 35 is electrically connected to the electrode portion 16. Further, on the passivation layer 32, the common electrode 38 is provided, and electrically connected to the electrode portion 15 as well. That is, by the signal voltage impression operation on the gate electrode 33, the voltage impressed between the common electrode 38 and the source electrode 34 is impressed between the electrode portions 15 and 16, that is, the electrode layers 12 and 13, and the electric field is impressed on each of displacement layers 11 resulting in changing its film thickness, accordingly changing the film thickness of the laminated body 10.

To supply the signal voltage to be impressed on the laminated body 10, it is not necessary to use the above-described TFT element. For TFT element, as described in followings, the convenience that the actuator devices are 2-dimensionally arranged and independently driven is considered, and as long as the displacement layer can be displaced, any embodiment may also be used for a means to impress the electric field.

(Drive of the Actuator Device)

Figure 3:
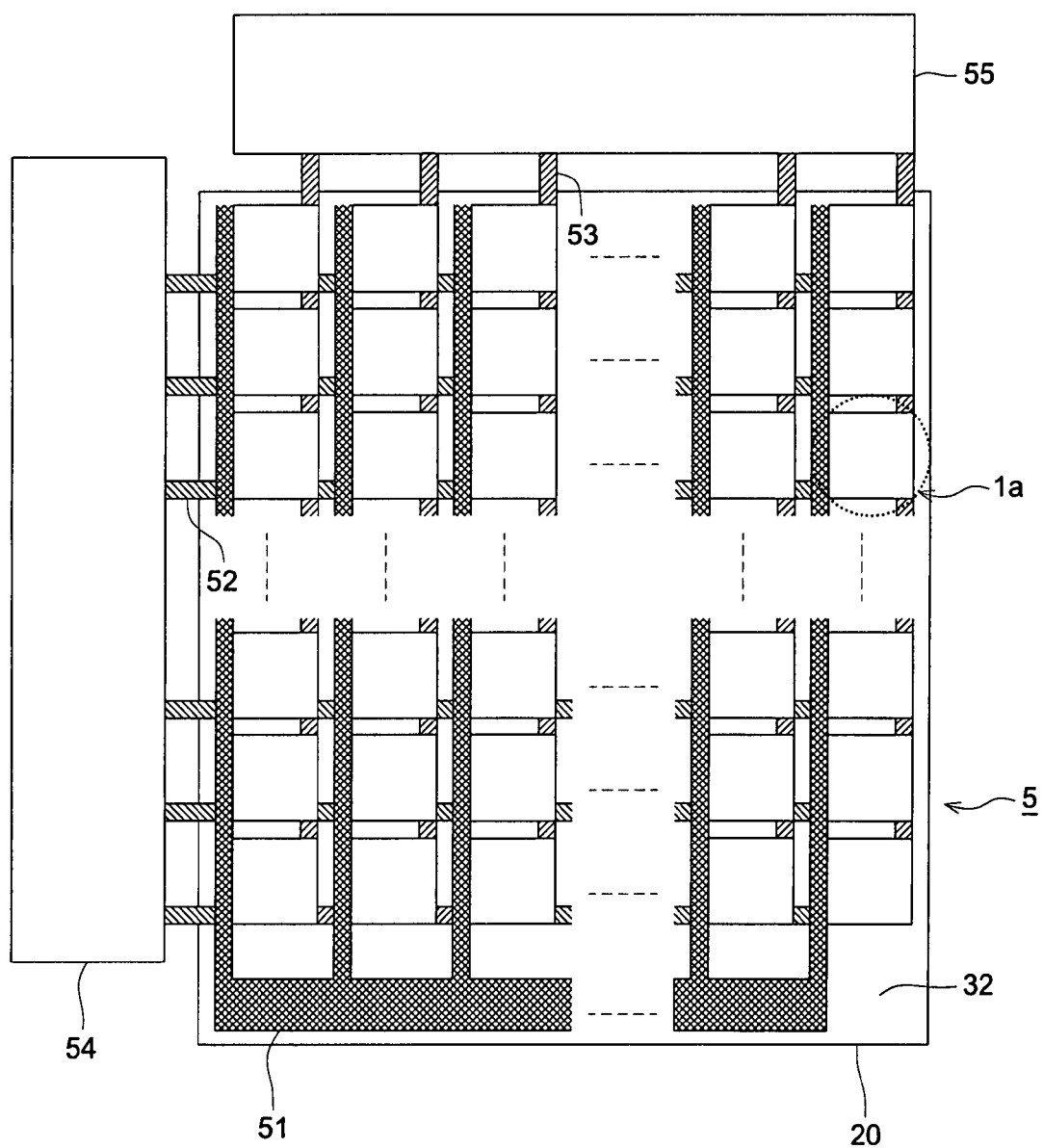
FIG. 3 is a view showing a 2-dimensional arrangement of the actuator devices 1 and a drive circuit of the device corresponding to the arrangement.

FIG. 3 is a view showing the 2-dimensional arrangement of the actuator devices 1 and a drive circuit of. the device corresponding to the arrangement. By using FIG. 3, the drive of the actuator device arrangement will be described below.

In FIG. 3, numeral 1*a* corresponds to the single actuator device shown in FIG. 1. However, it is not a sectional view but the view viewed from the upper surface. A plurality of actuator devices are arranged in plane as shown in the view, an actuator device array 5 is structured. However, the method of the arrangement, and the method of the drive corresponding to that the arrangement are various and are not limited to this.

These arrangements are totally formed in the shape of the drive circuit or wiring. Accordingly, all of them are not shown, however, when the TFT element 30 is formed, the components which can be made into common for each actuator device such as the common electrode 38 are made to be a corrective wiring. The signal lines to the gate electrodes 33 or source electrodes 34 are structured so that they are matrix driven corresponding to the arrangement. Further, the laminated body 10 independently controlled for each actuator device is also independently formed.

In FIG. 3, numeral 51 is the common electrode, and wired on the passivation layer 32 as shown in the view. Hereby, the electrode layers 15 of all actuator devices are connected to the common electrode 51, and the common electric potential can be given to the electrode portion 15. Further, numeral 53 is the signal bus line, and the signal voltage is given to the electrode portion 16 through the source electrode 34 of each actuator device. Whether the source electrode 34 gives the signal voltage to the electrode portion 16 or not is determined by the matrix drive related to the signal of the gate bus-line of numeral 52.

Hereupon, the component to give the signal to the gate bus-line 52 is the driver IC for the gate of numeral 54, and the component to give the signal to the signal bus-line 53 is the driver IC for the signal of numeral 55. Accordingly, the combination of the signals which are fed by the both ICs matrix-drives each actuator. Accordingly, the operation by which the electric field is impressed or not on the laminated body for each actuator device is determined.

(Layer Structure of the Actuator Device Considering the Manufacturing)

In the actuator device 1 of the present embodiment, the laminated body 10 is the actuator part which is capable of displacing, further, each displacement layer 11 structuring the laminated body 10 generates the displacement by the electric field, that is, generates the change of the film thickness.

Accordingly, the laminated body 10 of the present actuator device 1 has the laminated layer structure of a plurality of displacement layers 11 to secure the displacement amount. Further, for the laminated layer structure of the multi-layer thin film of this laminated body 10, the easiness of the manufacturing is also considered. The actuator device can be formed by repeatedly laminating the thin films of the fixed pattern of small number.

Figure 4:
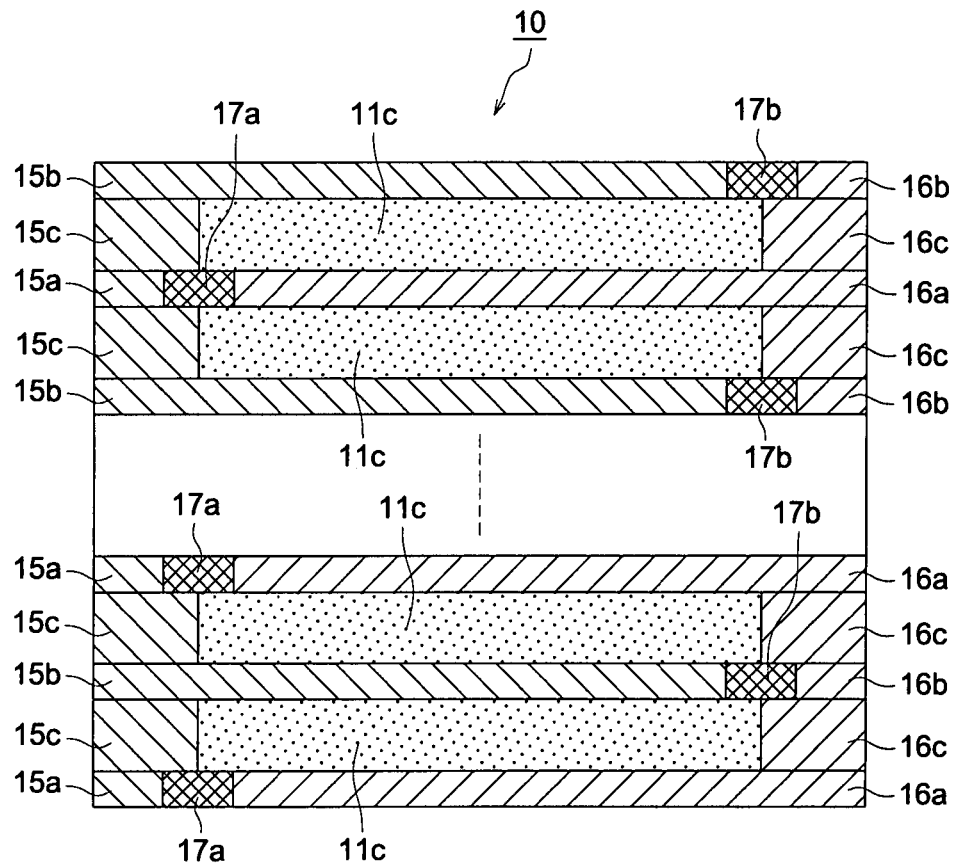
FIG. 4 is a sectional view of the actuator part of the actuator device 1, that is, the laminated body 10.

In reference to FIG. 4, the laminated layer structure considering the manufacturing of the laminated body 10 in the actuator device 1 and its laminated layer forming sequence will be described. FIG. 4 is a sectional view of the laminated body 10.

In FIG. 4, the laminated body 10 is the structure in which three kinds of layer patterns, that is, the electrode layer 13, and displacement layer 11, and the electrode layer 12 are repeatedly laminated in this order. Each layer is formed of at least three areas.

The electrode layer 13 is formed of a narrow electrode layer electrode region 15a and a narrow electrode layer electrode region 16a, and an insulation region 17a for separating the both electrodes so that they are not electrically connected each other. The electrode layer 12 is formed of a wide electrode layer electrode region 15b, a narrow electrode layer electrode region 15b and a narrow isolation region 17b for separating the both electrodes so that they are not electrically connected each other. Further, the displacement layer 11 is formed of a wide displacement region 11c, a narrow displacement layer electrode region and a narrow displacement layer electrode region 16c, and the electrodes are not mutually electrically connected. Further, the displacement layer 11 is formed of a wide displacement region 11c, a narrow displacement layer electrode region 15c which is not mutually electrically connected, and a narrow displacement layer electrode region 16c. Hereinafter, the electrode layer electrode region and the displacement layer electrode region are both called the electrode region, and when the distinction is necessary, it is shown by the afore-mentioned numerals.

The two electrode regions, which are not mutually electrically connected, of the two layers are positioned to be a pair of electrode parts 15 and 16, and when they,are laminated, the electrode regions 15a, 15b and 15c are mutually electrically connected in one electrode region, and the electrode 16a, 16b and 17b are mutually electrically connected in the other electrode region.

Further, each of the displacement regions 11c in the displacement layers 11 is sandwiched between the electrode region 16a and 15b respectively of the electrode layers 13 and 12 which are not mutually electrically connected and are included in the above-mentioned pair of the electrode portions 15 and 16.

The actuator device 1 has the laminated body 10 of such a layered structure as mentioned above as the actuator part. Practically, the laminated body 10 is formed on the substrate 20, or between them TFT element 30 for driving the actuator part by a signal electric field may also be formed.

By taking such a layered structure, it can be simply manufactured by laminating patterns successively. Further, when the layers in which a plurality of the arrays of the actuator devices are integrated are laminated, a plurality of the actuator device arrays can also be formed at once.

The constituent materials of the actuator device and the method of manufacturing by using them will be described below.

(Constituent Material of the Actuator Device)

Members structuring the actuator device as shown in FIG. 1 will be described. Typical materials will be described for each area of the displacement part structuring the laminated body 10, insulation part, electrode part and the substrate.

As a material forming the deformable displacement region 11c, various organic materials are well known. They are well known as so-called polymer actuator and are the material in which deformation such as expanding, contracting, bending is caused by the electric field or other stimulation exclusive of dynamic one,. It can realize a life-like motion with low energy and attracts interest from various fields.

In the actuator device mentioned above, the expansion and contraction by the electric field are utilized, and known various polymer actuator can be used for that purpose. In them, as the preferable material, poly aniline, polypyrrole, polythiophene, polyvinylidene fluoride and silicon rubber can be listed.

As the material for the insulation region (17 and so on), various insulation materials are well known, and the material is not limited as long as it is not substantially conductive. Polymer such as polyimide, polyamide, polyester, polyacrylate, polyvinyl phenol, polyvinyl alcohol, novolak resin, inorganic oxide such as silicon oxide, aluminium oxide, tantal oxide, titan oxide, banadium oxide, or inorganic nitride such as silicon nitride, alminium nitride, or inorganic titanate group such as titanic acid barium strontium, zirconium acid titanic lead, titanic acid lead lanthanum can be listed.

As the material for the electrode regions (15a, 15b, 15c, 16a, 16b, 16c), various conductive material are well known, when it is conductive at a practical level, it can be used particularly without being limited. Specifically, platinum, gold, silver including the paste-like, nickel, chromium, copper, iron, tin, antimon lead, tantalium, indium, paradium, tellurium, lenium, illidium, aluminum, ruthenium, gerumanium, molybdenum, tungsten, tin oxide. antimon, indium tin oxide (ITO), fluorine-doped zinc oxide, zinc, graphite, or glassee-carbon, and carbon including carbon paste, litium, beryllium, sodium, magnesium, kalium, calcium, scandium, titanium, manganese, zirconium, gallium, niob, natrium-kalium alloy, magnesium/copper mixture, magnesium/silver mixture, magnesium/aluminium. mixture, magnesium/indium mixture, litium/aluminium mixture can be used.

Further, as the conductive material, the conductive polymer can also be appropriately used. As the conductive polymer, for example, polyacethylene, polyanyline, polypirol, polythyofen, polyparaphenilene, polyethylene dioxytiophen (PEDOT), and these derivative, analog pair, monomer structuring these or to polymer having oligomer as the component, the appropriate additives are added at need, when it has the conductivity at the practical level, it can be used without a problem. Specifically, for example, complex of polyaniline and polystyrene sulfone acid or carbon acid, complex of polyethylene dioxitiofene and polystyrene sulfon acid or carvone acid are appropriately used.

Further, as the conductive material, a particle-dispersed medium including metallic fine particle can also be used. As the particle-dispersed medium including the metallic fine particle, for example, publicly known conductive paste may also be used, and the particle-dispersed medium including metallic fine particle whose diameter is from 1 nm to 50 nm is more preferable, and one including fine particle the diameter of which is from 1 nm to 10 nm is more preferable. The kind of metal including as the fine particle, platinum, gold, silver, nickel, chrome, copper, iron, tin, antimony lead, tantal, indium, paradium, tellulium, lenium, ilidium, aluminium, ruthenium, germanium, moribdenum, tungsten, zinc can be listed. It is preferable to form the electrodes by using the dispersed medium such as water or arbitrary organic solution in which these metallic fine particles are dispersed by using the dispersion stabilizer formed mainly of organic material. Hereupon, as the method of manufacturing such a dispersed medium dispersed of metallic fine particle, the physical generation method such as evaporation method in the gas, spattering method, metallic vapor composition method, or the chemical generation method, in which the metallic ion is reduced in the liquid phase into metallic fine particles, such as choroid method, co-precipitation method can be listed.

The substrate 20 as the support body may be a glass substrate or a resin substrate. For the glass substrate the material is not particularly limited, however, generally, glass used for the liquid crystal display can be used. For the resin substrate, for example, plastic film sheet can be used. As the plastic film, the film, for example, such as polyethylene terephthalate (PET), polyethylene naphthalate (PEN), poly ether sulphone (PES), polyether imide, polycarbonate (PC), cellulose triacetate (TAC), cellulose acetate propionate (CAP) can be listed. When the plastic film is used in this manner, the weight reduction can be intended as compared to the case where the glass substrate is used, the portability is enhanced and the durability to the impact can be improved.

(Method of Manufacturing the Actuator Device)

The actuator device can be formed by laminating and arranging the above-described electrode material, insulation material, and the organic displacement material which is a polymer actuator in the appropriate layer.

For the method of conducting the patterning, there is no particular limitation, however, it is preferable not to use the component that deteriorates the materials constituting the actuator device or interferes the actuator device's execution of its function, for example, mask evaporation method, spray-coat method, spin-coat method, blade cord method, dip coat method, cast method, roll-coat method, bar-coat method, die coat method, gravure printing method, screen printing method, inkjet printing method, micro-contact print method, and LB method are listed, and they can be used in accordance with the material.

In them, particularly preferable one is, micro-contact print method, or inkjet printing method. In the case of the inkjet printing method, the publicly known inkjet printing method such as piezo-electric system may be used, however, the electrostatic suction system is also preferable because it can form a fine pattern. Further, in the case of the micro-contact print method, the method written in Japanese Translation of PCT International Application Publication No. 2005-509229, or Japanese Translation of PCT International Application Publication No. 2005-521238, can be used by adding some change in accordance whit the material to be used.

All manufacturing process of the actuator device 1 of the present embodiment is preferably conducted in the lower temperature than about 200° C. The temperature lower than about 150° C. is more preferable. The selection of the temperature generally depends on the processing parameter. The method of manufacturing the actuator device 1, in which each material of the organic material is made into layer pattern and laminated, makes the processing temperature considerable lower than the processing temperature of the conventional inorganic actuator available, and also makes the use of comparatively low cost substrates such as a flexible polymer substrate available.

As described above, the actuator device 1 of the present embodiment can be manufactured in low cost by the simple manufacturing method. Examples of the specific manufacturing method will be described.

EXAMPLES

By using from FIG. 5 to FIG. 7(b), the manufacturing method of the actuator device 1, particularly, the manufacturing method of the laminated body 10 will be described. From FIG. 5 to FIG. 7(b) are figures of apparatus for explaining the manufacturing process.

There are two main processes. The layer forming process for forming the layer pattern in which the layer forming material is arranged to be a film on the transfer section of the transfer apparatus, and the layer transfer process for transferring the layer pattern formed by the layer forming process from the transfer section of the transfer apparatus onto the substrate. That is, in the case that the displacement layer is formed by using the organic displacement material, the two processes are the displacement layer forming process and the displacement layer transfer process, and in the case that the electrode layer is formed by using the conductive material, the two processes are the electrode layer forming process and the electrode layer transfer process.

Accordingly, the layer pattern of this displacement layer and the layer pattern of the electrode layer are successively transferred onto the substrate, and the laminated body 10 is formed.

Manufacturing Example 1

Figure 5:
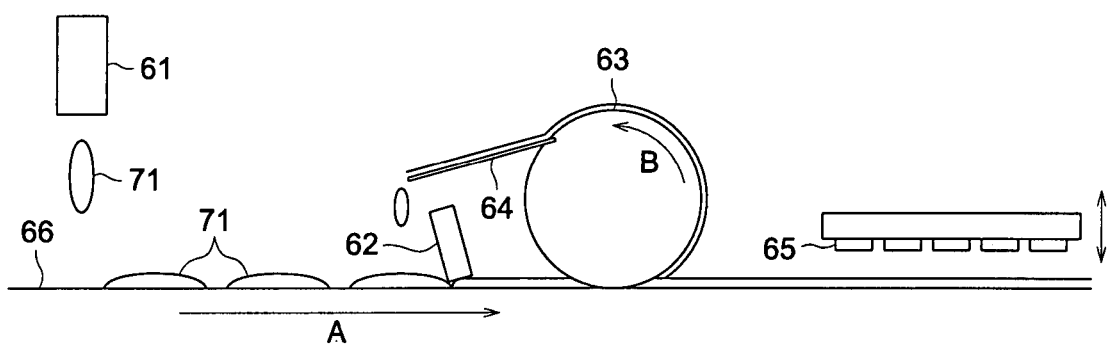
FIG. 5 is a sectional view of the device for explaining the manufacturing process of the actuator device 1.
Figure 6:
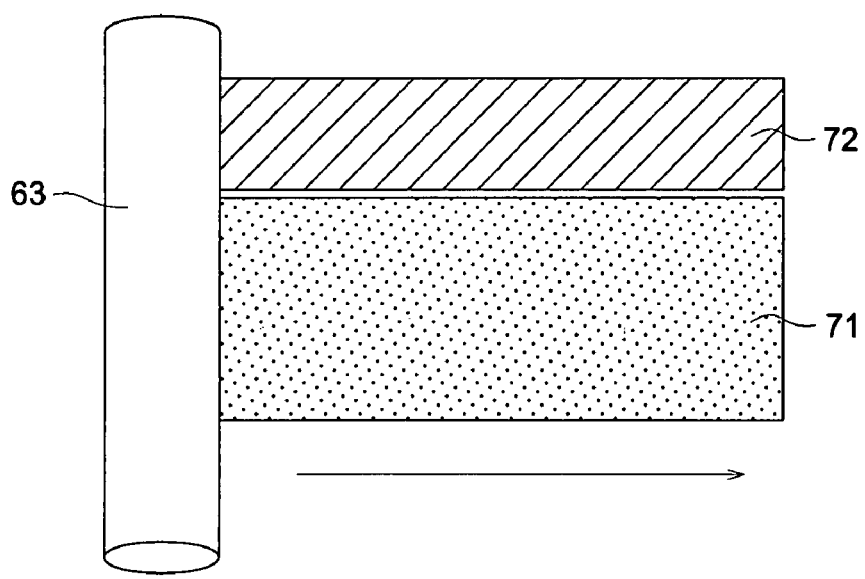
FIG. 6(a) is a plan view of a thin layer pattern formation by a squeeze roller for describing the formation process of the displacement layer formed of a plurality of regions.
FIG. 6(b) is an enlarged sectional view of a transfer section corresponding to FIG. 6(a).
Figure 6:
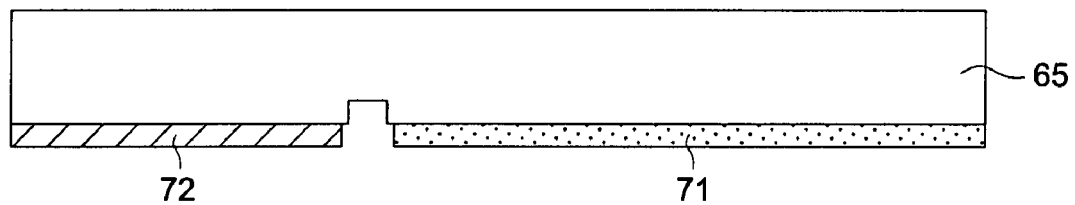

Initially, by representing the every layer formation, referring to FIG. 5, example of the displacement layer forming process will be described. FIG. 5 is an apparatus sectional view for explaining the manufacturing process.

As the organic displacement material, the solution in which polyvinylidene fluoride is dissolved in the solvent is prepared. The viscosity is adjusted to about 1 Pa ·s.

The solution is discharged on the conveying body 66 from heated discharge nozzle 61. The heating temperature is 85° C., and the discharged liquid drop per one time is 100 pl. As the discharge nozzle, Dispenser ML-606X made by Musashi Engineering Co. is used. The frequency of discharge is 0.1 Hz.

Dropped liquid organic displacement material 71 is conveyed in the arrow mark A direction by the conveying body 66. The organic displacement material 71 is formed into the thin film of 8 μm by the applicator 62.

After that, by using a plurality of squeeze rollers (in FIG. 5, only the last squeeze roller 63 is shown), finally it is made into thin layer of about 800 nm and transferred onto transfer section 65. The transfer section 65 is moved up and down. On the transfer section 65, the thin layer of the organic displacement material 71 is about 400 nm.

Next, the displacement layer transfer process will be described.

In FIG. 5, a plurality of the transfer sections 65 are arrayed on the transfer apparatus, and a plurality of laminated bodies can be simultaneously formed. The size of each transfer section 65 is 2 mm square, and the transfer sections 65 are arranged in the matrix-shape of 5×5.

For the transfer section 65, polydimethyl siloxane (PDMS) is used. For the transfer apparatus, alignment is conducted by using the micro contact printer PA400 made by K. K Nanotech.

The thin film of the organic displacement material 71 on the transfer section 65 is transferred onto the substrate (not shown). On the substrate, it is transferred and printed in matrix, and the final film thickness is about 200 nm.

After printing, in order to evaporate the solvent from the thin film of the organic displacement material 71, the print is conducted on the hot plate of 120° C., and a plurality of printing operations are conducted with an appropriate interval. Further, after each thin film is formed, an appropriate electric field is impressed in the thickness direction in each case so that the electric charge amount of the thin film and polarization amount are adjusted in the appropriate condition.

The above process for forming the displacement layer, and a mask evaporation process of aluminum for forming the electrode layer, are alternately repeated about 20 layers are formed. As a result, the total thickness of whole laminated body is about 4 μm. When the voltage of about 60 v is impressed, the deformation amount of about 10% is obtained, it is confirmed that it operates as the actuator.

Manufacturing Example 2

Further, referring to FIG. 6(a) and FIG. 6(b), example of the forming process of displacement layers having a plurality of areas, will be described. FIG. 6(a) is a plan view of the thin layer pattern formation by the squeeze roller, FIG. 6(b) is an enlarged sectional view of the transfer section corresponding to that.

As shown in FIG. 6(a), in the process which is until the thin layer is formed by the final squeeze roller 63, a different point from the manufacturing example 1 is that in the manufacturing example 2 the electrode region of the conductive material 72 is simultaneously formed together with the displacement region of the organic displacement material 71.

In the case of the apparatus of FIG. 5, at least two kinds of discharge nozzles are prepared, and the organic displacement material 71 and the conductive material 72 are dropped. For the conveying body 66 and squeeze roller 63, a means such as a groove is provided in the border part of the thin film of the organic displacement material 71 and the conductive material 72 so that the both material are not mutually.

In this manner, the mutually adjoining strip-like displacement region and electrode region are formed.

They are collectively transferred onto the transfer section 65. FIG. 6(b) shows the appearance that the thin layer of the organic displacement material 71 and the conductive material 72 have been transferred onto the transfer section. In the transfer section 65, a groove is provided at the border part between the organic displacement material 71 and the conductive material 72, and the transferred organic displacement material 71 and the conductive material 72 are transferred while the groove is aligned with the border part of the thin layer.

In this situation, the printing onto the substrate is conducted in the same manner as the manufacturing example 1. The following processes are the same as the manufacturing example 1.

In this manner, the layers can be formed with the displacement layers pattered. Of course, instead of the electrode region, the insulation region may be formed, or the both may be formed. It is also possible to simultaneously form areas more than three by preparing discharge nozzles as described later.

Manufacturing Example 3

Figure 7A:
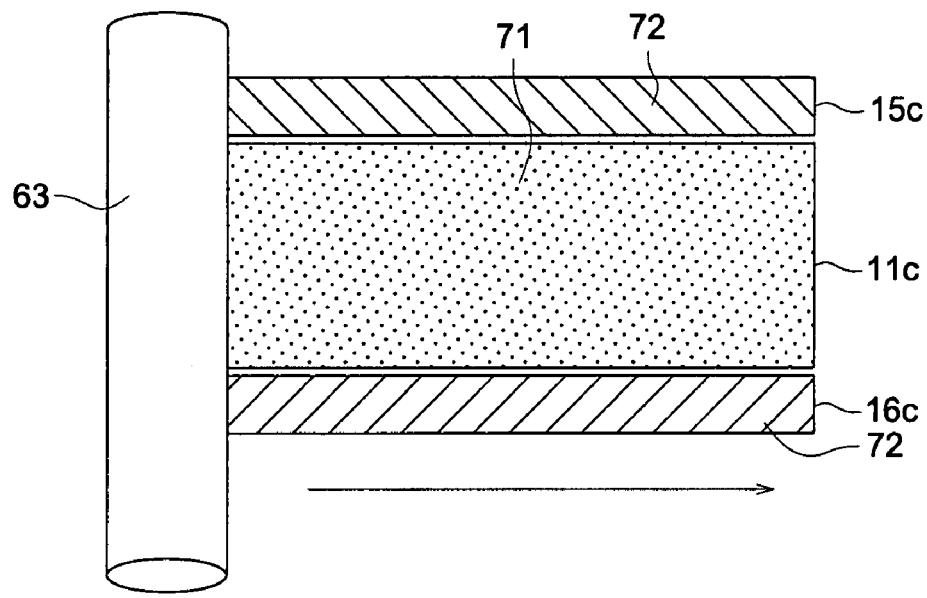
FIG. 7(a) is a plan view of displacement layer pattern formation by the squeeze roller for describing the formation by the same manufacturing method of laminated displacement layer and the electrode layer.

Further, referring to FIG. 7(a), and FIG. 7(b), an example of the forming process of the displacement layer and the electrode layer in which laminated displacement layer and the electrode layer are formed by the same manufacturing method will be described. FIG. 7(a) is a plan view of the displacement layer pattern formation by the squeeze roller, and FIG. 7(b) is a plan view of the electrode layer pattern formation by the squeeze roller.

As shown in FIG. 7(a), in the process which is until the thin layer is formed by the final squeeze roller 63, the difference point from the manufacturing examples 1 and 2 is that two electrode regions (15c, 16c) of the conductive material 72 are simultaneously formed together with the displacement region (11c) of the organic displacement material 71 while sandwiching the displacement region (11c) between the electrode regions (15c, 16c).

Figure 7B:
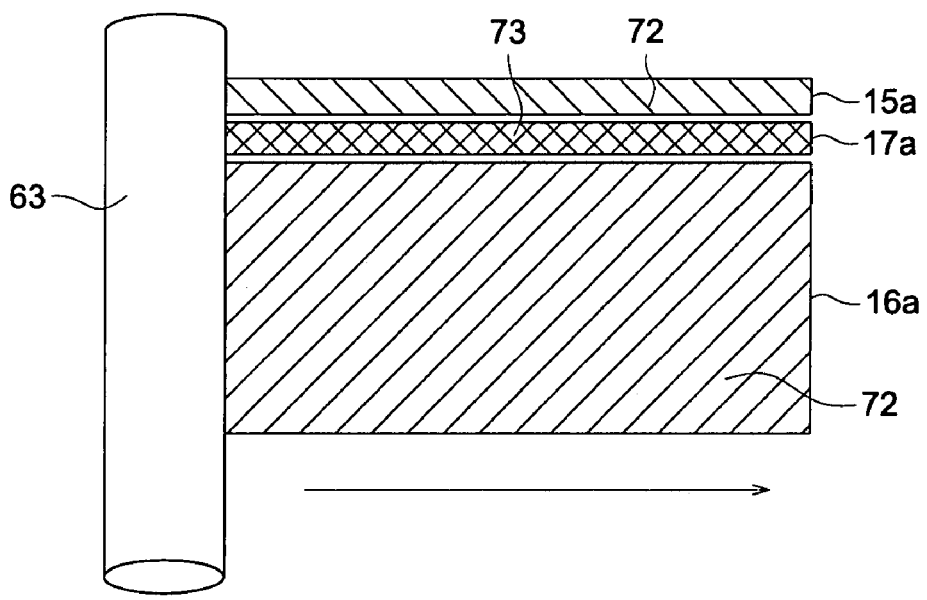
FIG. 7(b) is a plan view of the electrode layer pattern formation for the same.

Further, FIG. 7(b) similarly shows the appearance that two electrode regions (15a, 16a) by the conductive material 72 and the insulation region (17a) of the insulation material 73 for separating the electrode regions (15a, 16a): have been simultaneously formed in the process until thin layers are formed by the final squeeze roller 63.

In any case of the layers, in reference to the apparatus of FIG. 5, at least three kinds of the spitting nozzles are prepared, and the organic displacement material 71 and the conductive material 72, or the conductive material 72 and the insulation material 73 are dropped.

In this manner, the pattern of the displacement layer of FIG. 7(a), and the pattern of the electrode layer of FIG. 7(b), can be formed. Regarding the pattern of the electrode layer, in the same manner, a pattern (formed of two electrode region 15b, 16b and the insulation region 17b) which is symmetric to FIG. 7(b) and different in area are also formed.

The laminated body is formed by successively and repeatedly transferring and printing these three patterns on the substrate as in the manufacturing example 1. Further, as in the manufacturing example 1, the voltage is impressed, and it is confirmed that it operates as the actuator.

As described above, according to the present embodiment, by manufacturing the actuator device as the laminated structure including the layer which deforms by the electric field and the electrode layer, there is provided the lamination type actuator whose environmental load is small, and whose drive force is kept practical while the displacement amount is large. Further, according to the lamination structure of the above device, a simple manufacturing method is provided by arranging the each layer to be formed on the transfer section and transferring it to laminate on the substrate. By this manufacturing method, miniaturization and integration can also be easy, and the array of a plurality of elements can also be simultaneously manufactured.

Hereupon, the scope of the present invention is not limited to the above embodiment. As long as it is within the sprits of the present invention, their modified embodiment is also included in its scope.

What is claimed is:

1. An actuator device including a laminated body, comprising:
    (a) a plurality of displacement functioning layers which are displaced in a direction of thickness in response to application of an electric field; the displacement functioning layer including:
        (a-1) a displacement region which is displaced in a direction of thickness in response to the application of the electric field; and
        (a-2) a pair of displacement functioning layer electrode regions which are separated by the displacement region, and
    (b) a plurality of electrode functioning layers which are adapted to hold the displacement functioning layer therebetween to apply the electric field in the direction of thickness of the displacement functioning layer, the electrode functioning layer including:
        (b-1) an insulation region which is formed of a different material than the material used for the displacement region and provided in a vicinity of an interface of the displacement region and the displacement functioning layer electrode region of the displacement functioning layer; and
        (b-2) a pair of electrode functioning layer electrode regions which are separated by the insulation region, wherein the laminated body includes the displacement functioning layer and the electrode functioning layer, each of the pair of the displacement functioning layer electrode regions and each of the pair of the electrode functioning layer electrode regions are electrically connected to each other, and those connected displacement functioning layers and electrode functioning layers compose electrode sections which are adapted to apply the electric field to the displacement region.

2. The actuator device of claim 1, wherein the laminated body includes the electrode functioning layers and the displacement functioning layers alternately laminated each other, and the displacement functioning layer is thicker than the electrode functioning layer.

3. The actuator device of claim 1, wherein the displacement region is formed of an organic displacement material which is displaced in a direction of thickness in response to application of an electric field, and the insulation region is formed of a material different than the organic displacement material.

* * * * *